United States Patent
Hencken et al.

(10) Patent No.: US 11,726,131 B2
(45) Date of Patent: Aug. 15, 2023

(54) METHOD FOR DETECTING AN ELECTRICAL DISCHARGE IN AN ELECTRICAL APPARATUS AND SYSTEM THEREFOR

(71) Applicant: ABB Schweiz AG, Baden (CH)

(72) Inventors: Kai Hencken, Lörrach (DE); Holger Kaul, Mannheim (DE); Jörg Gebhardt, Mainz (DE); Yannick Maret, Dättwil (CH); Andrej Krivda, Wettingen (CH)

(73) Assignee: ABB Schweiz AG, Baden (CH)

( * ) Notice: Subject to any disclaimer, the term of this patent is extended or adjusted under 35 U.S.C. 154(b) by 86 days.

(21) Appl. No.: 17/380,313

(22) Filed: Jul. 20, 2021

(65) Prior Publication Data

US 2022/0018887 A1    Jan. 20, 2022

(30) Foreign Application Priority Data

Jul. 20, 2020 (EP) .................................. 20186742

(51) Int. Cl.
    *G01R 31/327* (2006.01)
    *G01R 31/12* (2020.01)
    *G01S 11/16* (2006.01)

(52) U.S. Cl.
    CPC ..... *G01R 31/1209* (2013.01); *G01R 31/3271* (2013.01); *G01S 11/16* (2013.01)

(58) Field of Classification Search
    CPC ................ G01R 31/12; G01R 31/1209; G01R 31/1272; G01R 31/3275; G01R 19/04
    See application file for complete search history.

(56) References Cited

U.S. PATENT DOCUMENTS

| | | |
|---|---|---|
| 6,774,639 B1 | 8/2004 | Unsworth |
| 2005/0194979 A1 | 9/2005 | Roman et al. |
| 2015/0091598 A1 | 4/2015 | Han et al. |
| 2016/0341782 A1* | 11/2016 | Huang ............... G01R 31/1209 |
| 2017/0168024 A1* | 6/2017 | Dehghan Niri .... G01R 31/1227 |
| 2020/0225274 A1 | 7/2020 | Manson et al. |
| 2020/0400736 A1* | 12/2020 | Severns ............. G01R 31/1227 |
| 2021/0190839 A1* | 6/2021 | Lim ....................... G01R 31/14 |
| 2021/0190849 A1* | 6/2021 | Najafi ..................... F03D 17/00 |

FOREIGN PATENT DOCUMENTS

| | | | |
|---|---|---|---|
| KR | 10-2013-0028545 A | | 3/2013 |
| KR | 20160074022 | * | 6/2016 |
| WO | WO 2011/118923 A2 | | 9/2011 |

OTHER PUBLICATIONS

European Patent Office, Extended European Search Report in European Patent Application No. 20186742.1, 8 pp. (dated Jan. 26, 2021).

* cited by examiner

*Primary Examiner* — Thang X Le
(74) *Attorney, Agent, or Firm* — Leydig, Voit & Mayer, Ltd.

(57) ABSTRACT

The present disclosure provides a detection system that includes a first sensing device configured for sensing an acoustic wave and an electromagnetic wave and generating a first combined signal and a signal processing device configured to determine the occurrence and properties of an electrical discharge.

18 Claims, 3 Drawing Sheets

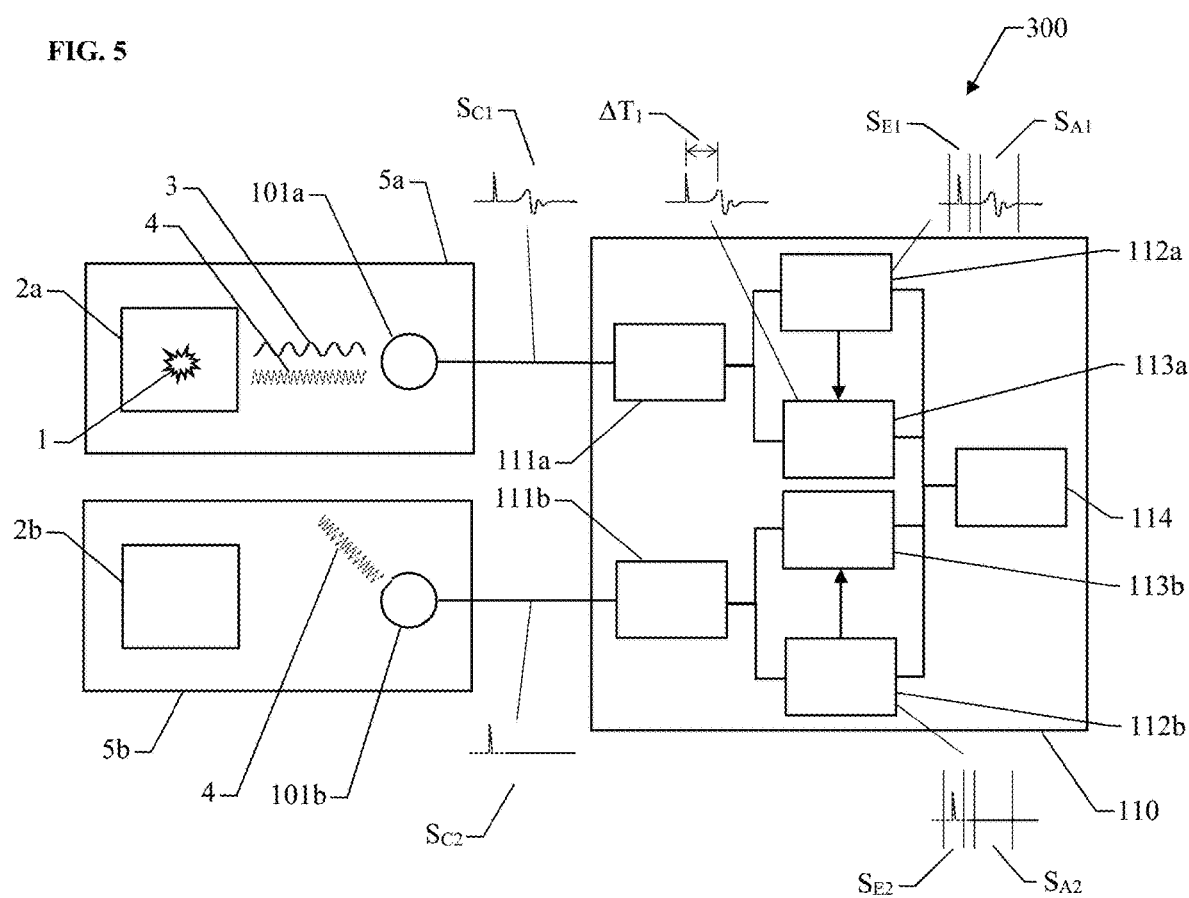

METHOD FOR DETECTING AN ELECTRICAL DISCHARGE IN AN ELECTRICAL APPARATUS AND SYSTEM THEREFOR

CROSS-REFERENCE TO RELATED APPLICATIONS

This patent application claims the benefit of European Patent Application No. 20186742.1, filed Jul. 20, 2020, which is fully incorporated herein by reference.

TECHNICAL FIELD

Embodiments of the present disclosure relate to a method for detecting an electrical discharge in an electrical apparatus, particularly partial discharges, and particularly in electrical switchgear. Further embodiments of the present disclosure relate to a detection system for detecting an electrical discharge in an electrical apparatus, particularly a detection system for carrying out said method.

BACKGROUND

Electrical apparatus, particularly medium-voltage or high-voltage electrical switchgear, may be susceptible to electrical discharges occurring in various components of the apparatus. A focus for monitoring of electrical apparatus is the detection and classification of electrical discharges, in particular partial discharges. The presence of electrical discharges may be indicative of a defect in a component, which may lead to failure of the electrical apparatus. Several different types of partial discharge may occur, including a partial discharge occurring in a void of an insulating component, a partial discharge occurring at a surface of an insulating component, or a partial discharge occurring at the surface of a metallic component. Identifying the type of partial discharge is important, as some types of partial discharge may result in severe damage to the component or apparatus, while others may be present for a longer time period before damaging effects are realized. In addition, localizing the origin of the partial discharge is important to allow for repair or replacement of the defective component to be carried out.

Several approaches for detecting partial discharges already exist in the state of the art. For example, detection systems may be used which are based on the effects of the discharge on the electrical quantities of the system, for example, the voltage and current measured through capacitive or inductive principles. The detection systems may also detect indirect effects arising from a partial discharge, such as electromagnetic or acoustic emissions. However, in order to not only identify the type of partial discharge, but also to localize the source of the partial discharge, existing systems rely on a combination of multiple sensors, the signals from which are processed using a variety of techniques such as triangulation to identify the location of the partial discharge.

One example of a partial discharge detection system is described by Mariño et al "An experimental measuring instrument to characterize partial discharges by sensor fusion" (ISBN 978-1-4244-4656-8). Therein, partial discharge signals simultaneously measured using multiple electric and ultrasonic sensors are post-processed to allow for partial discharge characterization based on the identification of the cause of the partial discharge and the localization of the source. The post-processing involves the processing of signals from several acoustic sensors for triangulation, with a signal from an electric sensor used as a trigger for time-of-flight determination.

A further example of a partial discharge detection system is described in European Patent No. 3 223 025. Therein, a first sensor mounted to a gas-insulated apparatus and a second sensor mounted to a power cable are capable of detecting a partial discharge signal, and a time difference detecting unit is provided to detect the time difference between a signal from the first sensor and a signal from the second sensor. A processing unit is provided to locate the occurrence of the partial discharge based on the time difference.

Such systems, which often rely on calculating a time difference between signals from multiple sensors, or by calculation of the time-of-flight of signals from multiple sensors, may be problematic if the signals from each sensor are not properly synchronized. Further, external disturbances may affect the detection of partial discharges. These external disturbances may be caused by external sources of acoustic or electromagnetic waves, or may be caused by discharges occurring outside the monitored apparatus, for example, in a neighboring electrical apparatus. In some applications of electrical apparatus, such as applications of electrical switchgear where a plurality of switchgears is installed in proximity to one another, these external disturbances are challenging to overcome in order to accurately identify the type and location of a partial discharge. Furthermore, existing systems which rely on multiple time-synchronized sensors are costly to implement, calibrate and maintain.

SUMMARY

In view of the above challenges and problems arising in the state of the art, improved methods and systems for detecting partial discharges in electrical apparatus are sought.

According to a first aspect of the present disclosure, a method for detecting an electrical discharge in an electrical apparatus is provided. The method includes sensing an acoustic wave and an electromagnetic wave using a first sensing device and generating a first combined signal, and processing the first combined signal to determine the occurrence and properties of an electrical discharge.

According to a second aspect of the present disclosure, a detection system for detecting an electrical discharge in an electrical apparatus is provided. The system includes a first sensing device configured for sensing an acoustic wave and an electromagnetic wave and generating a first combined signal, and a signal processing device configured for processing the first combined signal to determine the occurrence and properties of an electrical discharge.

Other embodiments include (non-volatile) computer-readable storage media or devices, and one or more computer programs recorded on one or more computer-readable storage media or computer storage devices. The one or more computer programs can be configured to perform particular operations or processes by virtue of including instructions that, when executed by one or more processors of a system, in particular a system as explained herein, cause the system to perform the operations or processes.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 5 is a schematic block diagram of a detection system according to further embodiments of the present disclosure.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

Figure 1:
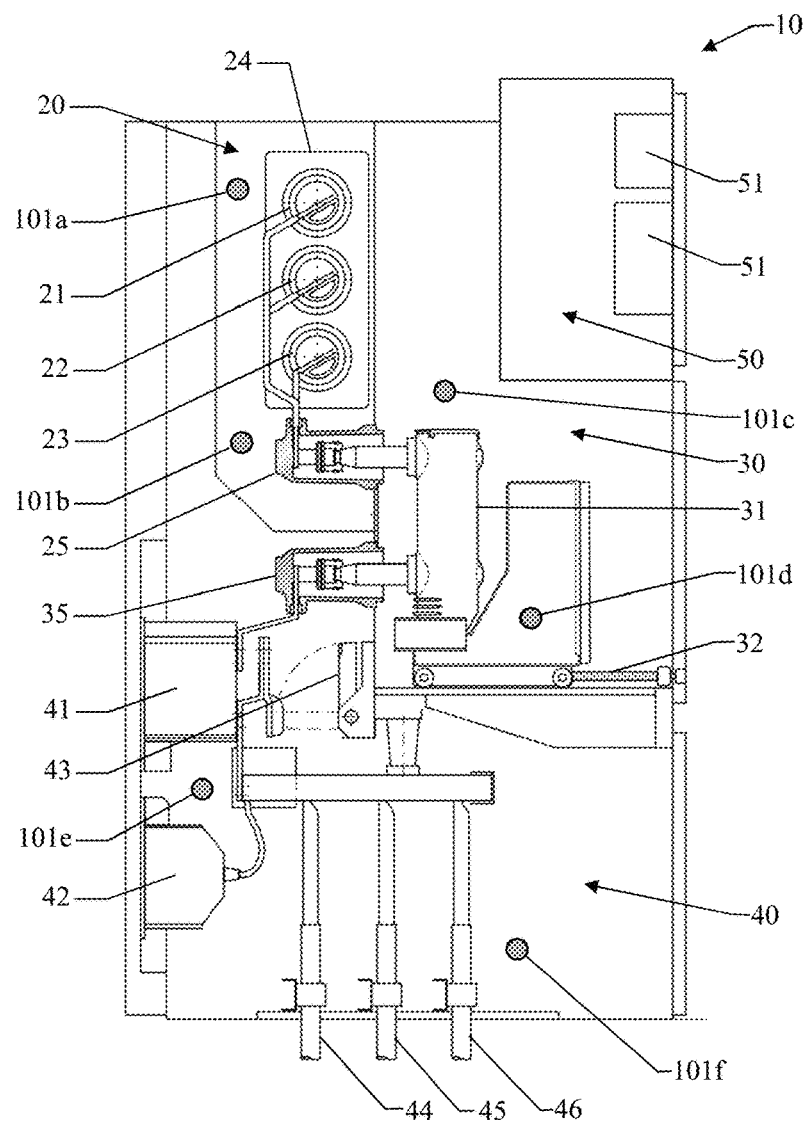
FIG. 1 illustrates an internal side view of an electrical switchgear having a detection system according to embodiments of the present disclosure.

Reference will first be made to FIG. 1, which shows an internal side view of an electrical apparatus. In particular, the electrical apparatus exemplarily shown in FIG. 1 is a three-phase electrical switchgear 10, however the present disclosure is not limited thereto. The electrical apparatus may be divided into a plurality of compartments, and each respective compartment may be provided to house components of the electrical apparatus. As exemplarily shown in the electrical switchgear 10 of FIG. 1, the plurality of compartments may include, for example, a busbar compartment 20, a circuit breaker compartment 30, a cable terminal compartment 40 and a control compartment 50. Each respective compartment is provided for separating groups of components Busbar compartment 20 is provided to house a plurality of busbars. In the exemplary three-phase electrical switchgear 10, three busbars 21, 22, 23 are provided. Busbars 21, 22, 23 serve as the connections of the electrical switchgear 10, and extend horizontally and protrude out of busbar compartment 20 such that busbars 21, 22, 23 may be connected to the respective busbars of a neighbouring electrical switchgear. Busbars 21, 22, 23 may be supported by at least one insulating busbar support 24, and may include a plurality of insulators. Busbar support 24 may be constructed so as to support all three busbars 21, 22, 23 simultaneously. Each one of busbars 21, 22, 23 may be connected to each respective one of a plurality of bushings or contact fingers 25, wherein bushings or contact fingers 25 are provided to pass through a separating wall between busbar compartment 20 and circuit breaker compartment 30.

Circuit breaker compartment 30 is provided to house a plurality of circuit breakers 31. An input side of each one of circuit breakers 31 is connected to each respective one of bushings or contact fingers 25. An output side of each one of circuit breakers 31 are connected to each respective one of bushings or contact fingers 35 provided to pass through a separating wall between circuit breaker compartment 30 and cable terminal compartment 40. As exemplarily shown in the electrical switchgear of FIG. 1, bushings or contact fingers 25, 35 are configured to be pluggable components, such that circuit breakers 31 may be plugged and unplugged from bushings or contact fingers 25, 35 by moving circuit breakers 31 on drawers 32.

Cable terminal compartment 40 is provided to house a variety of components in the exemplary electrical switchgear 10. In particular, cable terminal compartment 40 houses current transformers 41, voltage transformers 42, earthing switches 43 and cable terminations 44, 45, 46. An input side of each one of voltage transformers 42 is connected to each respective one of bushings or contact fingers 35. Cable terminations 44, 45, 46 serve as the connections of the electrical switchgear, and are exemplarily provided to pass through a floor panel of the electrical switchgear 10.

Control compartment 50 is provided to house a variety of control components 51 in the exemplary electrical switchgear 10. The control components 51 may include, for example, at least one of a controller, a monitoring device, a data logging device or a display device. Providing such control components 51 in a separate compartment allows for the control components 51 to be electrically shielded from other compartments and other components in the electrical switchgear 10 which operate at significantly higher voltages than the control components 51, preventing electrical interference and erroneous operation of the control components 51.

Figure 2:
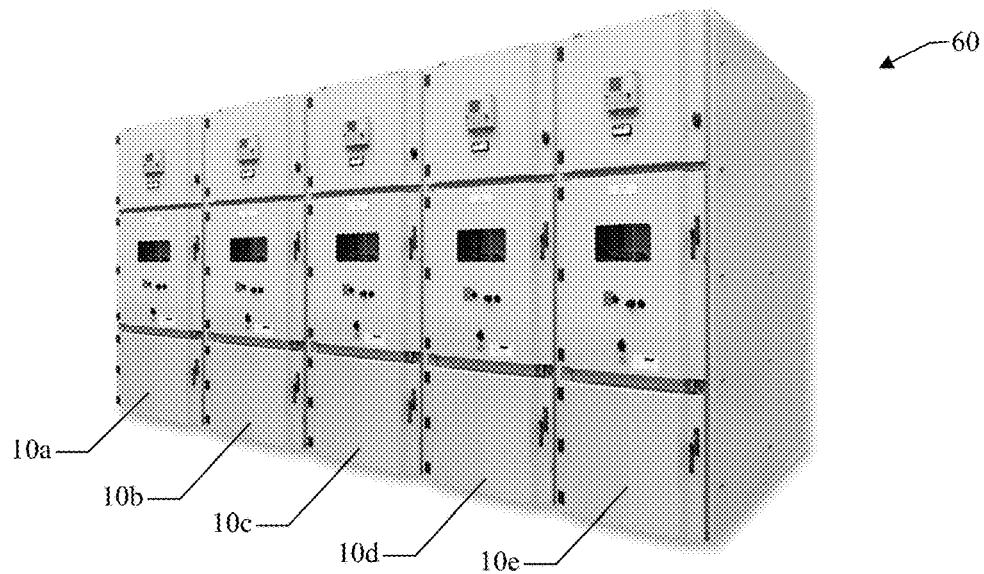
FIG. 2 illustrates a perspective view of a plurality of electrical switchgear having a detection system according to embodiments of the present disclosure.

Referring now to FIG. 2, a plurality of the electrical switchgear 10a-e exemplarily shown in FIG. 1 may be provided. The plurality of electrical switchgear 10a-e may be installed side-by-side such that busbars of one electrical switchgear are connected to the busbars of the neighbouring electrical switchgear to form a bank of electrical switchgear 60. Five electrical switchgear 10a-e are exemplarily provided in the bank of electrical switchgear 60 of FIG. 2, however any number of electrical switchgears 10a-e may be provided.

The electrical apparatus, may be, for example, a medium- or high-voltage electrical apparatus. In the context of the present disclosure, the term "medium-voltage" may refer to a voltage of at least 1 kV. Particularly, the term "medium-voltage" may refer to a voltage of at least 600 V and up to 69 kV. Further, the term "high-voltage" in the context of the present disclosure may refer to a voltage of at least 69 kV. Particularly, the term "high-voltage" may refer to a voltage of at least 69 kV and up to 230 kV.

Although the electrical apparatus exemplarily shown in FIGS. 1 and 2 is an electrical switchgear, the present disclosure is not limited thereto. The electrical apparatus, particularly the medium- or high-voltage electrical apparatus, may be at least one of the group comprising an electrical air-insulated switchgear, an electrical gas-insulated switchgear, an air-insulated electrical transformer, a gas-insulated electrical transformer, or an electrical motor. The electrical apparatus may be an electrical device configured for alternating current or direct current.

In the electrical apparatus, abnormal electrical discharges may be indicative of a defect in an electrical component. In particular, partial discharges may occur locally at or within a component, potentially causing damage to the component or failure of the electrical apparatus. A partial discharge may occur due to a localized dielectric breakdown of a small portion of an electrical insulation when subjected to high voltage stress. A "partial discharge" is so named as the discharge does not completely bridge the space between two conductors, but instead is limited to only a portion of the insulation or at a boundary between insulation materials, such that the discharge only partially bridges the space between two conductors or between a conductor and ground.

An electrical discharge event dissipates energy in the form of electromagnetic waves, heat, sound and light. In other words, a single occurrence of an electrical discharge in an electrical apparatus emits energy, particularly pulses of energy, in the form of an electromagnetic wave and an acoustic wave, among others. The latter arises as parts of the discharge energy is converted into heat. Sensors may be deployed within the electrical apparatus to detect these various waves in order to monitor the occurrence of electrical discharge events.

In one type of electrical discharge, a partial discharge may occur within an insulation material of a component in an electrical apparatus. In this case, the partial discharge may originate at the location of a gas-filled void, crack or inclusion present in a solid insulation material, or may originate at the location of a gas-filled bubble within a liquid insulation material. In the context of the present disclosure, such a partial discharge is referred to from hereafter as an "internal partial discharge".

In another type of electrical discharge, a partial discharge may occur on the surface of an insulation material of a component in an electrical apparatus. In this case, the partial discharge may originate at the interface between a solid insulation material and the surrounding gas, particularly air. In the context of the present disclosure, such an electrical discharge is referred to from hereafter as a "surface partial discharge".

In yet another type of electrical discharge, a partial discharge may occur at the surface of a metallic component in an electrical apparatus, for example, a corona shield, an electrode or a metallic shield. In this case, the electric field at the surface of the metallic component causes the gas immediately surrounding the metallic surface to ionize, creating a region of plasma. In the context of the present disclosure, such an electrical discharge is referred to from hereafter as a "corona partial discharge". Further discharge types which occur in air and/or may interact with the air as an acoustic medium may also be similarly classified.

An electrical discharge event occurring at or within an insulation material, i.e. an internal partial discharge or a surface partial discharge, causes deterioration of the insulation material. With repetitive electrical discharge, the insulation material becomes progressively less effective at insulating the component, allowing further electrical discharge events to occur, eventually leading to complete electrical breakdown. Chemical transformation of the insulating material around the site of the electrical discharge tends to increase conductivity of the insulating material, further accelerating the breakdown process. Electrical discharges of the internal partial discharge type or the surface partial discharge type have the potential to cause critical damage to the component in the electrical apparatus in a short time, possibly causing complete failure of the electrical apparatus.

On the other hand, an electrical discharge event occurring at the surface of a metallic component, i.e. a corona partial discharge, may be tolerated by the electrical apparatus for some time before it becomes a critical problem. A corona partial discharge may cause acoustic or electromagnetic noise, may generate heat or active chemical species, like ozone, but may not result in damage to a component of the electrical apparatus.

In view thereof, while it is important to monitor electrical discharge events of all types, an electrical discharge event of the corona partial discharge type may be considered to be a less critical event than an internal partial discharge or a surface partial discharge. A reliable method and apparatus for detecting an electrical discharge which allows for identification of the type of electrical discharge is advantageous, so that effective monitoring of the electrical apparatus can be performed. Reliably detecting and identifying the type of electrical discharge allows for more effective operation of the electrical apparatus, such that the electrical apparatus may be deactivated if a critical electrical discharge is detected, or may be continued to be operated, for example at reduced demand, if a less critical or non-critical electrical discharge is detected.

Further, it is also desirable to identify the location of the electrical discharge. Particularly, the location of the electrical discharge originating from a specific defective component in the electrical apparatus may be identified, such that the specific defective component may be serviced or replaced. It is also desirable that the origin of the electrical discharge is able to be identified in the case where the electrical discharge occurs in a neighbouring electrical apparatus.

Figure 3:
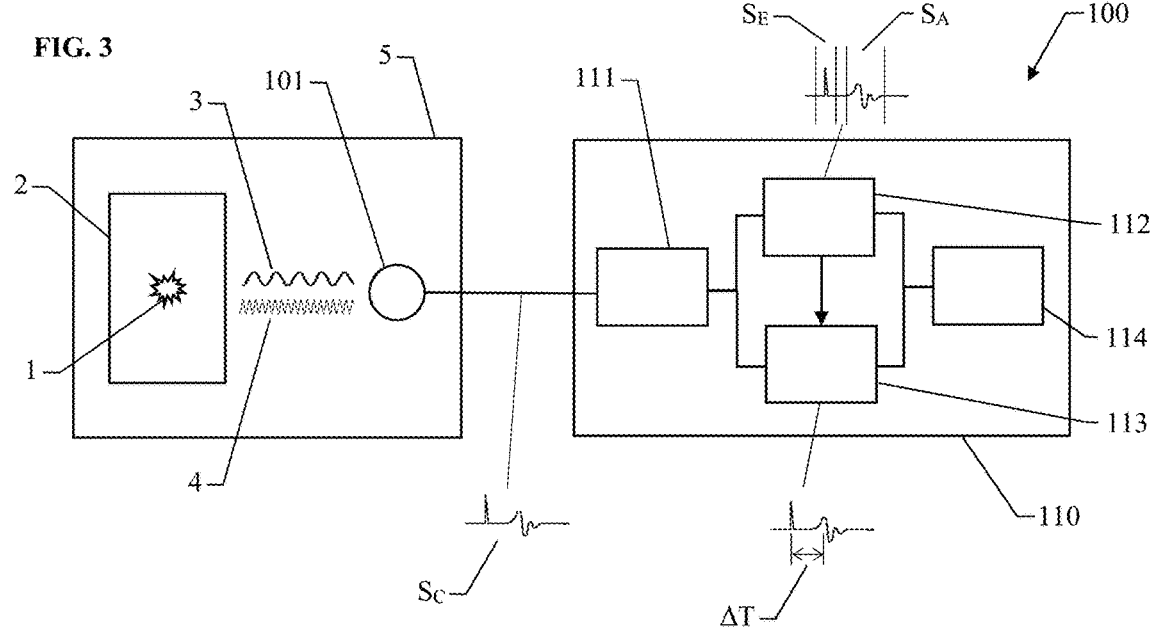
FIG. 3 is a schematic block diagram of a detection system according to embodiments of the present disclosure.

Reference will now be made to FIG. 3, which shows a schematic block diagram of a detection system 100, 200 for detecting an electrical discharge in an electrical apparatus 5 according to an aspect of the present disclosure. Particularly, the electrical discharge 1 may occur within an electrical component 2 included in electrical apparatus 5. Detection system 100, 200 includes a first sensing device 101, 101a, 101b configured for sensing an acoustic wave 3 and an electromagnetic wave 4 and generating a first combined signal $S_C$, $S_{C1}$, and a signal processing device 110 configured for processing the first combined signal $S_C$, $S_{C1}$ to determine the occurrence and properties of an electrical discharge 1.

Further, according to another aspect of the present disclosure, a corresponding method for detecting an electrical discharge in an electrical apparatus is provided. The method may be implemented using the detection system 100, 200 described herein. The method includes sensing an acoustic wave 3 and an electromagnetic wave 4 using a first sensing device 101, 101a and generating a first combined signal $S_C$, $S_{C1}$, and processing the first combined signal $S_C$, $S_{C1}$ to determine the occurrence and properties of an electrical discharge.

The detection system 100, 200 and the corresponding method described herein may be used for detecting electrical discharges in an electrical apparatus, particularly a medium- or high-voltage electrical switchgear described above and in FIGS. 1 and 2.

In the context of the present disclosure, determining the occurrence of an electrical discharge may include determining the presence or absence of an electrical discharge event, particularly a partial discharge event, and may further include determining whether the signals received originate from an electrical discharge event, or whether the signals received originate from a source of interference. Further, determining the properties of an electrical discharge may include determining the type of electrical discharge event, and/or determining the location of the origin of the electrical discharge event. Determining the occurrence and properties of an electrical discharge may further include determining whether the signals received originate from an electrical discharge event in the electrical apparatus being monitored by the first sensing device 101, 101a, or whether the signals received originate from an electrical discharge event in another electrical apparatus different to the electrical apparatus being monitored by the first sensing device 101, 101a.

Detection system 100, 200 includes a first sensing device 101, 101a which is configured for sensing an acoustic wave 3 and an electromagnetic wave 4. In other words, the first sensing device 101, 101a is sensitive to both acoustic waves and electromagnetic waves. As discussed previously, an electrical discharge event will emit an acoustic wave 3 and an electromagnetic wave 4, and by providing first sensing device 101, 101a which is sensitive to both acoustic waves and electromagnetic waves, both acoustic wave 3 and electromagnetic wave 4 emitted by the electrical discharge event may be detected by first sensing device 101, 101a.

First sensing device 101, 101a is configured to generate a first combined signal $S_C$, $S_{C1}$, wherein first combined signal $S_C$, $S_{C1}$ is a single signal including a component corresponding to the acoustic wave and a component corresponding to the electromagnetic wave. In other words, first sensing device 101, 101a may not be configured to provide separate signals for an acoustic signal and an electromagnetic signal, but is rather configured to provide a single superimposed signal including both the acoustic signal and the electromagnetic signal.

First sensing device 101, 101a may include a single sensor which is sensitive to both acoustic waves and electromagnetic waves. For example, the single sensor may be a microphone, the membrane of which is used, or mis-used, as the secondary plate of a capacitive coupler. The single sensor then generates first combined signal $S_C$, $S_{C1}$ directly, such that an output signal of first sensing device 101, 101a includes the acoustic component and the electromagnetic component. Alternatively, first sensing device 101, 101a may include a first sensor which is sensitive to acoustic energy, for example a microphone, and a second sensor which is sensitive to electromagnetic energy, for example an antenna, wherein the output of the first sensor and the output of the second sensor are superimposed within first sensing device 101, 101a to generate first combined signal $S_C$, $S_{C1}$ such that an output signal of first sensing device 101, 101a includes the acoustic component and the electromagnetic component. In both cases, first sensing device 101, 101a provides first combined signal $S_C$, $S_{C1}$ on a single output, for example, along a single electrical conductor.

An exemplary representation of first combined signal $S_C$, $S_{C1}$ is shown in FIG. 3. In a single electrical discharge event, an electromagnetic wave 4 propagates at the speed of light, while an acoustic wave 3 propagates at the speed of sound. Therefore, there is a time delay between the time when the first sensing device 101, 101a detects the electromagnetic wave 4 and the time when the first sensing device 101, 101a detects the acoustic wave 3. Due to this time delay, first sensing device 101, 101a produces a signal which may have two delimited components corresponding to each of the electromagnetic wave 4 and the acoustic wave 3, allowing for first combined signal $S_C$, $S_{C1}$ to be processed to separate the two signals, as well as allowing for the time delay between the two signals to be determined.

First sensing device 101, 101a may be provided as a single unit with a single signal connection to the signal processing device 110, allowing for a more cost-effective detection system while also providing sufficient information to identify the type and location of the electrical discharge 1. A further advantage is that first combined signal $S_C$, $S_{C1}$ may be processed with only a single data acquisition system, further reducing cost. Further, by providing both the acoustic signal and the electromagnetic signal in first combined signal $S_C$, $S_{C1}$, the detection system 100, 200 has the further advantage in that processing may be performed without additional time synchronization of the two signals.

First sensing device 101, 101a may be positioned on or within the electrical apparatus 5 so that an acoustic wave 3 and an electromagnetic wave 4 emitted by an electrical discharge 1 may be detected by first sensing device 101, 101a. For example, first sensing device 101, 101a may be positioned on an internal wall of electrical apparatus 5, in a free space enclosed by electrical apparatus 5, or on a component housed within electrical apparatus 5. Alternatively, electrical apparatus 5 may include a sensor opening, and first sensing device 101, 101a may be positioned outside of electrical apparatus 5 such that first sensing device 101, 101a may detect acoustic wave 3 and electromagnetic wave 4 inside electrical apparatus 5.

As discussed previously, and referring also to FIG. 1, electrical apparatus 5 may include a plurality of compartments. In this case, first sensing device 101, 101a may be positioned on or within one of the plurality of compartments, such that first sensing device 101, 101a may detect acoustic wave 3 and electromagnetic wave 4 inside the compartment. Alternatively, one of the plurality of compartments may include a sensor opening, and first sensing device 101, 101a may be positioned outside of the compartment such that first sensing device 101, 101a may detect acoustic wave 3 and electromagnetic wave 4 inside the compartment.

Detection system 100, 200 further includes a signal processing device 110. Signal processing device 110 is configured for processing first combined signal $S_C$, $S_{C1}$ to determine whether an electrical discharge 1 has occurred. Signal processing device 110 has at least one input channel through which first combined signal $S_C$, $S_{C1}$ is received from first sensing device 101, 101a. Signal processing device 110 may include any combination of analog and/or digital devices configured for processing electrical signals. For example, signal processing device 110 may include a microprocessor and at least one analog-to-digital converter (ADC), particularly a digital signal processor (DSP).

Signal processing device 110 may include at least one signal conditioner 111, 111a, 111b for conditioning first combined signal $S_C$, $S_{C1}$. For example, the at least one signal conditioner 111, 111a, 111b may be an analog amplifier, a filter, an analog-to-digital converter (ADC), or a combination of such devices, for example, an analog front-end (AFE) controller. However, the present disclosure is not limited thereto, and the at least one signal conditioner 111, 111a, 111b may be any analog or digital device configured for conditioning first combined signal $S_C$, $S_{C1}$.

According to an embodiment, which may be combined with other embodiments described herein, the processing may further include generating a first electromagnetic signal $S_E$, $S_{E1}$ from a component of the first combined signal $S_C$, $S_{C1}$ corresponding to the electromagnetic wave 4, and generating a first acoustic signal $S_A$, $S_{A1}$ from a component of the first combined signal $S_C$, $S_{C1}$ corresponding to the acoustic wave 3.

To perform the generating of first electromagnetic signal $S_E$, $S_{E1}$ and first acoustic signal $S_A$, $S_{A1}$, signal processing device 110 may include at least one categorizing unit 112. The at least one categorizing unit 112 may be configured for splitting first combined signal $S_E$, $S_{E1}$ into separate signals corresponding to the acoustic wave 3 and the electromagnetic wave 4.

According to an embodiment, which may be combined with other embodiments described herein, the processing may further include categorizing the electrical discharge 1 based on at least one of the first electromagnetic signal $S_E$, $S_{E1}$ and the first acoustic signal $S_A$, $S_{A1}$. In the context of the present disclosure, the categorizing based on one or more signals refers to any one of determining the presence or absence of the one or more signals, a comparison of one of the signals with another one of the signals, a determination of one or more characteristics of the one of more signals, or a comparison of the one or more signals to one or more stored reference signals. Characteristics of first electromagnetic signal $S_E$, $S_{E1}$ and first acoustic signal $S_A$, $S_{A1}$ may indicate the type of electrical discharge 1 which has been detected by first sensing device 101, 101a. These characteristics may include the presence or absence of at least one of first electromagnetic signal $S_E$, $S_{E1}$ and first acoustic signal $S_A$, $S_{A1}$, or the amplitude of at least one of first electromagnetic signal $S_E$, $S_{E1}$ and first acoustic signal $S_A$, $S_{A1}$. The characteristics may further include a frequency content of the respective waves, a pulse rate of the discharge, and/or a time pattern of the discharge.

For example, an internal partial discharge may be indicated by the presence of first electromagnetic signal $S_E$, $S_{E1}$ in combination with an absence, or at least a low amplitude, of first acoustic signal $S_A$, $S_{A1}$, as there the lack of first acoustic signal $S_A$, $S_{A1}$ indicates that the electrical discharge occurred in a location which does not lead to an acoustic response in air or a gas. On the other hand, a surface partial discharge may be indicated by an absence, or at least a low amplitude, or first electromagnetic signal $S_E$, $S_{E1}$ and a presence of first acoustic signal $S_A$, $S_{A1}$, as the presence of first acoustic signal $S_A$, $S_{A1}$ indicates that the electrical discharge occurred in a location which does lead to an acoustic response in air or a gas.

The categorizing of the electrical discharge 1 may include determining whether the electromagnetic wave 4 or the acoustic wave 3 detected by first sensing device 101, 101a was caused by an external disturbance. Characteristics of the first combined signal $S_C$, $S_{C1}$, particularly characteristics of first electromagnetic signal $S_E$, $S_{E1}$ or first acoustic signal $S_A$, $S_{A1}$, may indicate that the source of the electromagnetic wave 4 or acoustic wave 3 was an external disturbance. For example, if the amplitude of first electromagnetic signal $S_E$, $S_{E1}$ is below a certain predetermined amplitude, it can be determined that the electromagnetic wave 4 or acoustic wave 3 originated from an electrical apparatus which is different to the electrical apparatus being monitored.

The categorizing of the electrical discharge 1 may further include at least one of pattern recognition, machine learning, or other types of algorithms. For example, pattern recognition may be used to eliminate types of electrical discharges from consideration, for example, in the case where first sensing device 101, 101a is positioned in a compartment of electrical apparatus 5 where only specific components are located. For example, the compartment in which first sensing device 101, 101a may only include an insulated cable with no exposed metallic elements. In this case, it is known that internal partial discharges and surface partial discharges may occur in this compartment in or on the insulation material of the insulated cable. However, corona partial discharges are unlikely to occur in this compartment due to the lack of exposed metallic elements, and corona partial discharges may be disregarded from the categorization. Depending on the information provided, a pattern recognition algorithm or machine learning algorithm may improve the accuracy of the categorization of the type of electrical discharge and/or the estimation of the location from which the electrical discharge originates.

It follows that the location of which electrical discharge 1 originates from can be estimated. For example, since the position of first sensing device 101, 101a is known, or at least the compartment in which first sensing device 101, 101a is known, it follows that the location of the electrical discharge 1, or at least the compartment in which the electrical discharge 1 occurs, may be estimated based on this information. If first sensing device 101, 101a receives a high-amplitude signal indicating an electrical discharge, it can be estimated that the electrical discharge originated from a component near to first sensing device 101, 101a. In some cases, a compartment may include two or more different types of electrical components, which may be more or less susceptible to particular types of electrical discharges. It follows that, depending on the type of electrical discharge detected by the detection system 100, 200, the origin of the electrical discharge may be estimated to be one of the two or more components which is most susceptible to that type of electrical discharge, as the other components may not be susceptible to that type of electrical discharge.

To perform the categorizing of the electrical discharge 1, signal processing device 110 may include at least one evaluation unit 114. The at least one evaluation unit 114 may be configured for receiving and evaluating an output from the at least one categorizing unit 112. From the output received from the at least one categorizing unit 112, particularly from first electromagnetic signal $S_E$, $S_{E1}$ and first acoustic signal $S_A$, $S_{A1}$, the at least one evaluation unit 112 may evaluate the type of electrical discharge 1. The at least one evaluation unit 112 may be configured for determining at least one characteristic of first electromagnetic signal $S_E$, $S_{E1}$ and/or first acoustic signal $S_A$, $S_{A1}$, including the presence or absence of first electromagnetic signal $S_E$, $S_{E1}$ and/or first acoustic signal $S_A$, $S_{A1}$, at least one amplitude of first electromagnetic signal $S_E$, $S_{E1}$ and/or first acoustic signal $S_A$, $S_{A1}$. Further, the at least one evaluation unit 112 may be configured for comparing one or more signals, or may be configured for comparing first electromagnetic signal $S_E$, $S_{E1}$ and/or first acoustic signal $S_A$, $S_{A1}$ to at least one stored reference signal.

According to an embodiment, which may be combined with other embodiments described herein, the processing may further include determining a first time of flight $\Delta T$, $\Delta T_1$ between a peak amplitude of the first electromagnetic signal $S_E$, $S_{E1}$ and a peak amplitude of the first acoustic signal $S_A$, $S_{A1}$, and determining the location of the electrical discharge 1 based on the position of the first sensing device 101, 101a and the first time of flight $\Delta T$, $\Delta T_1$.

As discussed above, due to the electromagnetic wave 4 propagating at the speed of light and the acoustic wave 3 propagating at the speed of sound, there exists a time delay between the point in time in which first sensing device 101, 101a detects the electromagnetic wave 4 and the point in time in which first sensing device 101, 101a detects the acoustic wave 3. By measuring this time delay, first time of flight $\Delta T$, $\Delta T_1$ may be determined, and the distance from first sensing device 101, 101a and the location of the origin of the electrical discharge 1 can be determined. Since the location of first sensing device 101, 101a is known, it follows that the location of the origin of the electrical discharge 1 can be estimated based on the position of first sensing device 101, 101a and the calculated distance.

It follows that, since the layout and position of components inside electrical apparatus is known, more particularly the layout and position of components inside a compartment of electrical apparatus, it can be determined from which component inside electrical apparatus 5 the electrical discharge 1 originated. As discussed above, pattern recognition or machine learning algorithms may also be further implemented so as to determine from which component the electrical discharge 1 originated in the case where more than one component is located at the calculated distance away from first sensing device 101, 101a. It may be further appreciated, that should the first time of flight $\Delta T$, $\Delta T_1$ be determined to be above a prescribed value, i.e. an excessively long time delay, this may indicate that the location of the origin of electrical discharge 1 may be outside of the compartment or outside of the electrical apparatus.

The points in time at which first time of flight $\Delta T$, $\Delta T_1$ is determined are particularly chosen to correspond to a peak amplitude of the first electromagnetic signal $S_E$, $S_{E1}$ and a peak amplitude of the first acoustic signal $S_A$, $S_{A1}$. However, the present disclosure is not limited thereto, and any points in time may be determined or calculated from the respective first electromagnetic signal $S_E$, $S_{E1}$ and first acoustic signal $S_A$, $S_{A1}$ for determining first time of flight $\Delta T$, $\Delta T_1$. For example, the point of time at which the respective first electromagnetic signal $S_E$, $S_{E1}$ and first acoustic signal $S_A$, $S_{A1}$ exceeds a predetermined value may be used for determining first time of flight $\Delta T$, $\Delta T_1$.

Due to first sensing device 101, 101a generating a first combined signal $S_C$, $S_{C1}$ having both an acoustic signal and an electromagnetic signal, first time of flight $\Delta T$, $\Delta T_1$ can be determined directly from first combined signal $S_C$, $S_{C1}$ without performing a time synchronisation of the two signals. Therefore, the determining first time of flight $\Delta T$, $\Delta T_1$ and the determining a location of the origin of electrical discharge 1 can be performed with less processing steps and with lower signal processing requirements, thus reducing cost and improving the accuracy of the detection system 100, 200.

To perform the determining of a first time of flight $\Delta T$, $\Delta T_1$, signal processing device 110 may further include at least one time of flight calculation unit 113. As exemplarily shown in the figures, the at least one time of flight calculation unit 113 may receive signals from categorization unit 112 corresponding to first electromagnetic signal $S_E$, $S_{E1}$ and first acoustic signal $S_A$, $S_{A1}$. Alternatively, the at least one time of flight calculation unit 113 may receive first combined signal $S_C$, $S_{C1}$ and determine a first time of flight $\Delta T$, $\Delta T_1$ directly.

Figure 4:
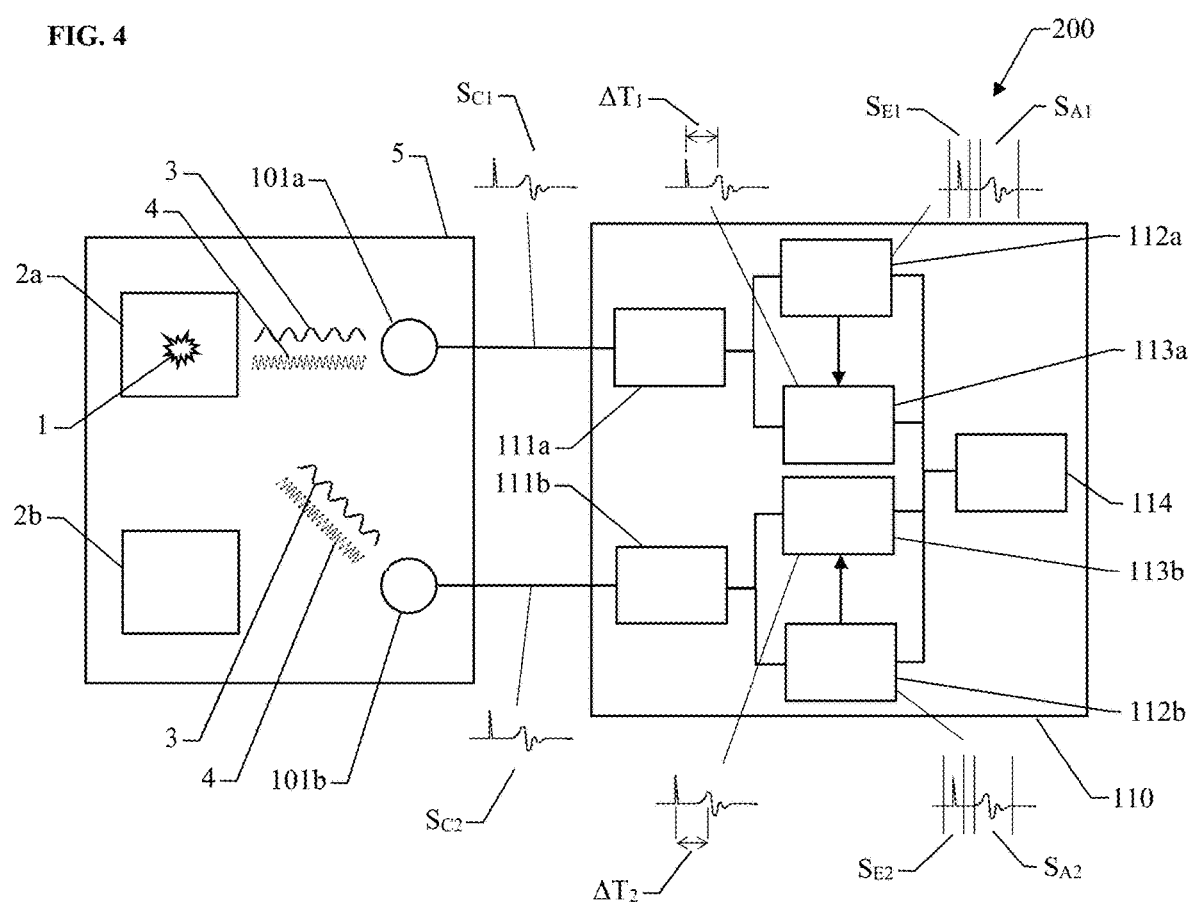
FIG. 4 is a schematic block diagram of a detection system according to further embodiments of the present disclosure.

Reference will now be made to FIGS. 4 and 5, which show detection system 200 according to further embodiments of the present disclosure. Detection system 200 may further comprise at least a second sensing device 101b configured for sensing the acoustic wave 3 and the electromagnetic wave 4 and generating a second combined signal $S_{C2}$, wherein the signal processing device 110 is further configured for comparing the first combined signal $S_{C1}$ and the second combined signal $S_{C2}$.

Further, a corresponding method according to a further embodiment of the present disclosure is provided, the method further including sensing the acoustic wave 3 and the electromagnetic wave 4 using at least one second sensing device 110b and generating at least one second combined signal $S_{C2}$, and wherein the processing further includes determining the location of the electrical discharge 1 by comparing the first combined signal $S_{C1}$ and the second combined signal $S_{C2}$.

By providing second sensing device 101b, detection system 200 may further include processing to compare the signal generated by first sensing device 101a and the signal generated by second sensing device 101b to further improve the accuracy of the identification of the type of electrical discharge, as well as the location of the origin of the electrical discharge. Second sensing device 101b is substantially identical to first sensing device 101a described above.

The comparison of the first combined signal $S_{C1}$ and second combined signal $S_{C2}$ may be performed by comparing the characteristics of the respective signals. Similarly for the single-sensor arrangement above, various characteristics of the respective signals can be determined, including the amplitude of the signal, and the absence or presence of each respective component of the signal.

For example, by comparing the relative amplitudes of the first combined signal $S_{C1}$ and second combined signal $S_{C2}$, and by considering the known positions of first sensing device 101a and second sensing device 101b, the location of the origin of the electrical discharge may be estimated. More particularly, the relative amplitudes of respective acoustic components of first combined signal $S_{C1}$ and second combined signal $S_{C2}$ may be compared to the relative amplitudes of respective electromagnetic components of first combined signal $S_{C1}$ and second combined signal $S_{C2}$. Due to the comparison of signals from multiple sensors, a more accurate and more reliable estimation of the origin of the electrical discharge can be achieved.

In another example, after comparing first combined signal $S_{C1}$ and second combined signal $S_{C2}$ it may be determined that first and second combined signals $S_{C1}$, $S_{C2}$ both indicate exactly the same characteristics. Such a comparison may be considered, in addition to other indicators, that the electromagnetic wave 4 and/or acoustic wave 3 detected by both first and second sensing devices 101a, 101b may have originated from an external disturbance located a significant distance away from first and second sensing devices 101a, 101b. Thus, by comparing multiple signals from multiple sensing devices, it becomes possible to improve the identification of external disturbances which are not attributed to electrical discharge, thereby further improving the reliability and accuracy of detection system 100, 200.

According to an embodiment, which may be combined with other embodiments described herein, the processing further includes generating a first electromagnetic signal $S_{E1}$ from a component of the first combined signal $S_{C1}$ corresponding to the electromagnetic wave 4, generating a first acoustic signal $S_{A1}$ from a component of the first combined signal $S_{C1}$ corresponding to the acoustic wave 3, generating a second electromagnetic signal $S_{E2}$ from a component of the second combined signal $S_{C2}$ corresponding to the electromagnetic wave 4, and generating a second acoustic signal $S_{A2}$ from a component of the second combined signal $S_{C2}$ corresponding to the acoustic wave 3. The processing further includes determining a first time of flight $\Delta T_1$ between a peak amplitude of the first electromagnetic signal $S_{E1}$ and a peak amplitude of the first acoustic signal $S_{A1}$, determining at least one second time of flight $\Delta T_2$ between a peak amplitude of the second electromagnetic signal $S_{E2}$ and a peak amplitude of the second acoustic signal $S_{A2}$, and determining the location of the electrical discharge 1 based on the position of the first sensing device 101a, the position of the at least one second sensing device 101b, the first time of flight $\Delta T_1$, and the second time of flight $\Delta T_2$.

Similar to the single-sensor arrangement discussed above, signal processing device 110 may include at least one signal conditioner 111a, 111b for conditioning first combined signal $S_{C1}$ and second combined signal $S_{C2}$. For example, the signal conditioners 111a, 111b may be an analog amplifier, a filter, an analog-to-digital converter (ADC), or a combination of such devices, for example, an analog front-end (AFE) controller. However, the present disclosure is not limited thereto, and the at least one signal conditioner 111, 111a, 111b may be any analog or digital device configured for conditioning first and second combined signals $S_{C1}$, $S_{C2}$.

Further, similar to the single-sensor arrangement discussed above, to perform the generating of the respective first and second electromagnetic signals $S_{E1}$, $S_{E2}$ and the respective first and second acoustic signals $S_{A1}$, $S_{A2}$, signal processing device 110 may further include at least one categorizing unit 112. Particularly, as exemplarily shown in FIGS. 4 and 5, signal processing device 110 includes a first categorizing unit 112a for generating first electromagnetic signal $S_{E1}$ and first acoustic signal $S_{A1}$, and a second categorizing unit 112b for generating second electromagnetic signal $S_{E2}$ and second acoustic signal $S_{A2}$.

Further, similar to the single-sensor arrangement discussed above, to perform the determining of the respective first and second times of flight $\Delta T_1$, $\Delta T_2$, signal processing device 110 may further include at least one time of flight calculation unit 113. Particularly, as exemplarily shown in FIGS. 4 and 5, signal processing device 110 includes first time of flight calculation unit 113a for determining first time of flight $\Delta T_1$ and second time of flight calculation unit 113b for determining second time of flight $\Delta T_2$.

Generally, signal processing device 110 may include one each of a signal conditioning unit 111, a categorizing unit 112, and a time of flight calculation unit 113 for each sensing device 110 attached thereto, as exemplarily shown for two sensing devices in FIGS. 4 and 5. The number of sensing devices is not limited thereto, and any number of sensing devices 101 may be used in the detection system 200.

As further exemplarily shown in FIGS. 4 and 5, a single evaluation unit 114 is provided for performing the determining of the location and/or the identifying of the type of electrical discharge, wherein the outputs from each one of categorizing units 112 and time of flight calculation units 113 are input into evaluation unit 114. However, the present disclosure is not limited thereto, and any number of evaluation units may be used. For example, one evaluation unit 114 may be provided for each compartment 5a, 5b included in electrical apparatus 5, so that sensing devices 101 from the same compartment are compared.

The two arrangements exemplarily shown in FIGS. 4 and 5 are substantially similar, however the locations of each of first sensing device 101a and the at least one second sensing device 101b are different. In the arrangement exemplarily shown in FIG. 4, the first and second sensing devices 101a, 101b are provided within the same electrical apparatus 5, particularly the same compartment of the same electrical apparatus 5. Particularly, electrical apparatus 5 may include a first electrical component 2a in which an electrical discharge 1 occurs, and may further include at least one second electrical component 2b. The electrical switchgear illustrated in FIG. 1 exemplarily shows this arrangement wherein, for example, sensing devices 101a, 101b are provided at different positions within busbar compartment 20.

In this arrangement, the first and second sensing devices 101a, 101b are both able to detect the acoustic wave 3 and the electromagnetic wave 4 emitted by the electrical discharge 1, as both sensing devices 101a, 101b are provided in the same compartment. However, due to the different relative distances between the first sensing device 101a and the origin of the electrical discharge 1, and between the second sensing device 101b and the origin of the electrical discharge 1, first combined signal $S_{C1}$ generated by first sensing device 101a is different to second combined signal $S_{C2}$ generated by second sensing device 101b. Particularly, first time of flight $\Delta T_1$ of first combined signal $S_{C1}$ is different to second time of flight $\Delta T_2$ of second combined signal $S_{C2}$. By considering the position of first sensing device 101a, the position of second sensing device 101b, first time of flight $\Delta T_1$ and second time of flight $\Delta T_2$, the location of the origin of the electrical discharge 1 can be estimated.

It follows that, by including more than two sensing devices and by processing and comparing more than two combined signals, the accuracy and reliability of detection system 200 can be even further improved, for example, through triangulation techniques.

For example, we refer to the arrangement shown in FIG. 1 wherein the busbar compartment 20 is provided with first sensing device 101a and second sensing device 101b. The positions of first and second sensing devices 101a, 101b are known, and the positions of busbars 21, 22, 23 and bushings or contact fingers 25 are also known. First sensing device 101a is positioned in the region of busbar 21, while second sensing device 101b is positioned in the region of bushings or contact fingers 25. Therefore, based on the position of first sensing device 101a, the position of second sensing device 101b, first time of flight $\Delta T_1$ and second time of flight $\Delta T_2$, it can be determined whether the electrical discharge has originated from busbar 21, or from bushings or contact fingers 25. By identifying the location of the electrical discharge, the defective component responsible for the electrical discharge can be easily identified and scheduled for repair or replacement.

By contrast to the arrangement shown in FIG. 4, the arrangement exemplarily shown in FIG. 5 includes first sensing device 101a provided in one compartment 5a of electrical apparatus 5, while the at least one second sensing device 101b is provided in a different compartment 5b of electrical apparatus 5. In other words, according to an embodiment, which may be combined with other embodiments described herein, the first sensing device 101a is configured for sensing the electromagnetic wave 4 and the acoustic wave 3 in one compartment 5a of the electrical apparatus 5, and the at least one second sensing device 101b is configured for sensing the electromagnetic wave 4 and the acoustic wave 3 in a different compartment 5b of the electrical apparatus 5.

In this arrangement, first sensing device 101a is able to detect both the acoustic wave 3 and the electromagnetic wave 4 emitted by electrical discharge 1. However, second sensing device 101b is only able to detect the electromagnetic wave 4 emitted by electrical discharge 1, as the acoustic wave 3 does not traverse the separation between the compartments 5a, 5b. It follows that the second combined signal $S_{C2}$ shows a presence of an electromagnetic signal and a significant absence of an acoustic signal. Note that the example shown in FIG. 4 does not show a calculation of a second time of flight $\Delta T_2$ as there is an absence of second acoustic signal $S_{A2}$ with which to calculate a time of flight.

Further, a combination of the arrangements shown in FIGS. 4 and 5 is possible. For example, a plurality of sensing devices 101 may be provided in one compartment of an electrical apparatus, and a plurality of sensing devices 101 may also be provided in a different compartment of an electrical apparatus. An expanded example of such an arrangement is also shown in the electrical switchgear illustrated in FIG. 1, wherein sensing devices 101a, 101b are provided in busbar compartment 20, further sensing devices 101c, 101d are provided in circuit breaker compartment 30, and further sensing devices 101e, 101f are provided in cable terminal compartment 40.

Similarly to the arrangement described above, FIG. 5 may also refer to an arrangement wherein the first compartment 5a and the second compartment 5b are different electrical apparatus. In other words, according to an embodiment, which may be combined with other embodiments described herein, the first sensing device 101a is configured for sensing the electromagnetic wave 4 and the acoustic wave 3 in one electrical apparatus, and the at least one second sensing device 101b is configured for sensing the electromagnetic wave 4 and the acoustic wave 3 in a different electrical apparatus.

In preferred embodiments of the present disclosure, the at least one second sensing device 101b is similar to the first sensing device 101a, however the present disclosure is not limited thereto. For example, the at least one second sensing device 101b may be any other type of sensing device for detecting electrical discharges, including sensing devices implementing measurement techniques based on capacitive and inductive principles. According to an embodiment of the present disclosure, which may be combined with other embodiments described herein, the method may further include sensing a property of the electrical apparatus 5 using at least a second sensing device 101b, wherein the processing further comprises comparing the first combined signal $S_{C1}$ and a signal from the at least one second sensing device 101b.

It follows that, for such an arrangement, the reliability and accuracy of the identification and location estimation of detection system 200 may be further improved. For example, by comparing the characteristics of first combined signal $S_{C1}$ as detected in a first electrical apparatus with the characteristics of second combined signal $S_{C2}$ as detected in a second electrical apparatus, it can be reliably determined that the electromagnetic wave 4 and/or acoustic wave 3 detected in the second electrical apparatus is not associated with an electrical discharge originating from the second electrical apparatus if the electromagnetic wave 4 and/or acoustic wave 3 detected in the first electrical apparatus can be shown to be associated with an electrical discharge originating from the first electrical apparatus. In view thereof, the electrical apparatus having the defective component can be identified reliably, so that replacement of the defective component can be carried out.

Similarly, if first combined signal $S_{C1}$ generated by first sensing device 101a in a first electrical apparatus 5a is found to have matching characteristics to second combined signal $S_{C2}$ generated by second sensing device 101b in a second electrical apparatus 5b, it could be determined that the electromagnetic wave 4 and/or acoustic wave 3 detected by both first sensing device 101a and second sensing device 101b originated from an external disturbance, as the characteristics of the signal measured by the sensing device in the electrical apparatus where the electrical discharge occurs should be different to the characteristics of the signal measured by the sensing device in another electrical apparatus.

According to embodiments, which may be combined with other embodiments described herein, the first and at least one second sensing device 101, 101a, 101b may be a microphone. In typical acoustic sensing applications, it is undesirable for microphones used for sensing acoustic energy to also be sensitive to electromagnetic energy. However, in the present application, microphones may be used not only for detecting acoustic energy, but also for detecting electromagnetic energy. The first and at least one second sensing device 101, 101a, 101b may be any type of microphone, such as a condenser microphone, a dynamic microphone, a piezoelectric microphone, a laser microphone, or a MEMS (microelectromechanical systems) microphone. In the preferred embodiment, the first and at least one second sensing device 101, 101a, 101b is a MEMS microphone, as a MEMS microphone is inexpensive and sufficiently sensitive to both acoustic energy and electromagnetic energy. However, the present disclosure is not limited thereto, and first sensing device 101, 101a and/or the at least one second sensing device 101b may include any sensing device which is sensitive to both acoustic energy and electromagnetic energy.

Alternatively, the first and the at least one second sensing device 101, 101a, 101b may be a combination of sensors which are arranged so as to generate a combined signal. For example, the first and the at least one second sensing device 101, 101a, 101b may include a microphone which is sensitive to acoustic energy, and an antenna which is sensitive to electromagnetic energy, wherein the signals from the microphone and the antenna are combined and output from the first and the at least one second sensing device 101, 101a, 101b as a single combined signal.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

REFERENCE NUMBERS

1 Electrical discharge
2, 2a, 2b Electrical component
3 Acoustic wave
4 Electromagnetic wave
5, 5a, 5b Electrical apparatus
10, 10a-e Electrical switchgear
20 Busbar compartment 21, 22, 23 Busbars
25, 35 Bushings or contact fingers
30 Circuit breaker compartment
31 Circuit breakers
32 Drawers
40 Cable terminal compartment
41 Current transformers
42 Voltage transformers
43 Earthing switches
44, 45, 46 Cable terminations
50 Control compartment
51 Control components
60 Bank of electrical switchgear
100, 200 Detection system
101, 101a First sensing device
101b Second sensing device
101c-f Further sensing devices
110 Signal processing device
111, 111a, 111b Signal conditioner
112, 112a, 112b Categorizing unit
113, 113a, 113b Time of flight calculation unit
114 Evaluation unit
$S_C$, $S_{C1}$ First combined signal
$S_{C2}$ Second combined signal
$S_E$, $S_{E1}$ First electromagnetic signal
$S_{E2}$ Second electromagnetic signal
$S_A$, $S_{A1}$ First acoustic signal
$S_{A2}$ Second acoustic signal
$\Delta T$, $\Delta T_1$ First time of flight
$\Delta T_2$ Second time of flight

The invention claimed is:

1. A method for detecting an electrical discharge in an electrical apparatus, the method comprising:
sensing an acoustic wave and an electromagnetic wave using a first sensing device and generating a first combined signal, the first combined signal containing an acoustic component and an electromagnetic component; and
processing the first combined signal to determine the occurrence and/or properties of an electrical discharge, wherein the processing further comprises:
generating a first electromagnetic signal from a component of the first combined signal corresponding to the electromagnetic wave;
generating a first acoustic signal from a component of the first combined signal corresponding to the acoustic wave;
determining a first time of flight between a peak amplitude of the first electromagnetic signal and a peak amplitude of the first acoustic signal; and
determining the distance of the electrical discharge from the position of the first sensing device based on the first time of flight.

2. The method for detecting an electrical discharge according to claim 1, wherein the processing further comprises:
categorizing the electrical discharge based on at least one of the first electromagnetic signal and the first acoustic signal.

3. The method for detecting an electrical discharge according to claim 1, further comprising:
sensing a property of the electrical apparatus using at least a second sensing device,
wherein the processing further comprises comparing the first combined signal and a signal from the at least one second sensing device.

4. The method for detecting an electrical discharge according to claim 3, wherein the first and at least one second sensing device is a microphone.

5. The method for detecting an electrical discharge according to claim 4, wherein the microphone is a micro-electro-mechanical system (MEMS) microphone.

6. The method for detecting an electrical discharge according to claim 1, further comprising:
sensing the acoustic wave and the electromagnetic wave using at least one second sensing device and generating at least one second combined signal, the at least one second combined signal containing an acoustic component and an electromagnetic component,
and wherein the processing further comprises:
determining a location of the electrical discharge by comparing the first combined signal and the at least one second combined signal.

7. The method for detecting an electrical discharge according to claim 6, wherein the first sensing device is configured for sensing the electromagnetic wave and the acoustic wave in one compartment of the electrical apparatus, and the at least one second sensing device is configured for sensing the electromagnetic wave and the acoustic wave in a different compartment of the electrical apparatus.

8. The method for detecting an electrical discharge according to claim 6, wherein the first sensing device is configured for sensing the electromagnetic wave and the acoustic wave in one electrical apparatus, and the at least one second sensing device is configured for sensing the electromagnetic wave and the acoustic wave in a different electrical apparatus.

9. The method for detecting an electrical discharge according to claim 1, wherein the electrical apparatus is a medium-voltage or high-voltage electrical switchgear.

10. A method for detecting an electrical discharge in an electrical apparatus, the method comprising:
sensing an acoustic wave and an electromagnetic wave using a first sensing device and generating a first combined signal, the first combined signal containing an acoustic component and an electromagnetic component;
processing the first combined signal to determine the occurrence and/or properties of an electrical discharge;
sensing the acoustic wave and the electromagnetic wave using at least one second sensing device and generating at least one second combined signal, the second combined signal containing an acoustic component and an electromagnetic component,
wherein the processing further comprises:
determining a location of the electrical discharge by comparing the first combined signal and the at least one second combined signal;
generating a first electromagnetic signal from a component of the first combined signal corresponding to the electromagnetic wave;
generating a first acoustic signal from a component of the first combined signal corresponding to the acoustic wave;
generating at least one second electromagnetic signal from a component of the at least one second combined signal corresponding to the electromagnetic wave;
generating at least one second acoustic signal from a component of the at least one second combined signal corresponding to the acoustic wave;
determining a first time of flight between a peak amplitude of the first electromagnetic signal and a peak amplitude of the first acoustic signal;

determining at least one second time of flight between a peak amplitude of the at least one second electromagnetic signal and a peak amplitude of the at least one second acoustic signal; and determining the location of the electrical discharge based on the position of the first sensing device, the position of the at least one second sensing device, the first time of flight, and the at least one second time of flight.

11. The method for detecting an electrical discharge according to claim 10, wherein the first sensing device is configured for sensing the electromagnetic wave and the acoustic wave in one compartment of the electrical apparatus, and the at least one second sensing device is configured for sensing the electromagnetic wave and the acoustic wave in a different compartment of the electrical apparatus.

12. The method for detecting an electrical discharge according to claim 10, wherein the first sensing device is configured for sensing the electromagnetic wave and the acoustic wave in one electrical apparatus, and the at least one second sensing device is configured for sensing the electromagnetic wave and the acoustic wave in a different electrical apparatus.

13. A detection system for detecting an electrical discharge in an electrical apparatus, the system comprising:

a first sensing device configured for sensing an acoustic wave and an electromagnetic wave and generating a first combined signal, the first combined signal containing an acoustic component and an electromagnetic component; and a signal processing device configured for processing the first combined signal to determine the occurrence and properties of an electrical discharge, wherein the processing further comprises:

generating a first electromagnetic signal from a component of the first combined signal corresponding to the electromagnetic wave;

generating a first acoustic signal from a component of the first combined signal corresponding to the acoustic wave;

determining a first time of flight between a peak amplitude of the first electromagnetic signal and a peak amplitude of the first acoustic signal; and determining the distance of the electrical discharge from the position of the first sensing device based on the first time of flight.

14. The detection system according to claim 13, further comprising at least one second sensing device configured for sensing the acoustic wave and the electromagnetic wave and generating a second combined signal, the second combined signal containing an acoustic component and an electromagnetic component, wherein the signal processing device is further configured for comparing the first combined signal and the second combined signal.

15. The detection system according to claim 13, wherein the first and at least one second sensing device is a microphone.

16. The detection system according to claim 15, wherein the microphone is a micro-electro-mechanical system (MEMS) microphone.

17. Use of the detection system according to claim 13 for detecting an electrical discharge in an electrical apparatus.

18. The use of the detection system according to claim 17, wherein the electrical apparatus is a medium-voltage or high-voltage electrical switchgear.

* * * * *